US006014929A

United States Patent [19]

Teng

[11] Patent Number: 6,014,929

[45] Date of Patent: Jan. 18, 2000

[54] LITHOGRAPHIC PRINTING PLATES HAVING A THIN RELEASABLE INTERLAYER OVERLYING A ROUGH SUBSTRATE

[76] Inventor: Gary Ganghui Teng, 10 Kendall Dr., Nothborough, Mass. 01532

[21] Appl. No.: 09/036,881

[22] Filed: Mar. 9, 1998

[51] Int. Cl.[7] .................... B41N 1/08; G03F 7/11

[52] U.S. Cl. .................... 101/456; 101/450.1; 101/459; 101/467; 430/302

[58] Field of Search .................... 101/454, 456, 101/457, 458, 459, 460, 462, 467, 450.1; 430/302, 303

[56] References Cited

U.S. PATENT DOCUMENTS

| | | | |
|---|---|---|---|
| 2,714,066 | 7/1955 | Jewett et al. | 101/456 |
| 3,181,461 | 5/1965 | Fromson | 101/456 |
| 3,511,661 | 5/1970 | Rauner et al. | 101/459 |
| 3,552,315 | 1/1971 | Ormsbee | 101/459 |
| 3,658,662 | 4/1972 | Casson et al. | 205/323 |
| 3,860,426 | 1/1975 | Cunningham et al. | 101/453 |
| 3,902,976 | 9/1975 | Walls | 205/127 |
| 3,964,389 | 6/1976 | Peterson | 101/467 |
| 3,997,349 | 12/1976 | Sanders | 430/303 |
| 4,074,009 | 2/1978 | Sanders | 428/421 |
| 4,082,902 | 4/1978 | Suzuki et al. | 101/453 |
| 4,104,072 | 8/1978 | Golda et al. | 430/302 |
| 4,132,168 | 1/1979 | Peterson | 101/471 |
| 4,153,461 | 5/1979 | Berghauser et al. | 101/456 |
| 4,399,021 | 8/1983 | Gillich et al. | 205/50 |
| 4,427,765 | 1/1984 | Mohr et al. | 430/525 |
| 4,467,028 | 8/1984 | Huang et al. | 430/302 |
| 4,477,317 | 10/1984 | Chu et al. | 205/201 |
| 4,508,814 | 4/1985 | Sakurai | 430/303 |
| 4,631,245 | 12/1986 | Powlowski | 430/175 |
| 4,772,538 | 9/1988 | Walls et al. | 430/284 |
| 4,879,193 | 11/1989 | Takaya et al. | 101/463.1 |
| 4,976,198 | 12/1990 | Ohba et al. | 101/459 |
| 5,258,263 | 11/1993 | Cheema et al. | 430/309 |
| 5,286,594 | 2/1994 | Sypek et al. | 430/138 |
| 5,310,869 | 5/1994 | Lewis et al. | 430/272 |
| 5,368,974 | 11/1994 | Walls et al. | 430/156 |
| 5,407,764 | 4/1995 | Cheema et al. | 430/15 |
| 5,476,754 | 12/1995 | Imai et al. | 430/302 |
| 5,491,046 | 2/1996 | DeBoer et al. | 430/302 |
| 5,493,971 | 2/1996 | Lewis et al. | 101/454 |
| 5,501,150 | 3/1996 | Leenders et al. | 101/466 |
| 5,506,090 | 4/1996 | Gardner et al. | 430/302 |
| 5,516,620 | 5/1996 | Cheng et al. | 430/309 |
| 5,561,029 | 10/1996 | Fitzgerald et al. | 430/281.1 |
| 5,605,780 | 2/1997 | Burbery et al. | 430/278.1 |
| 5,620,822 | 4/1997 | Kato et al. | 430/49 |
| 5,629,088 | 5/1997 | Ogawa et al. | 428/391 |
| 5,633,115 | 5/1997 | Jaeger et al. | 430/231 |
| 5,677,110 | 10/1997 | Chia et al. | 430/302 |
| 5,712,079 | 1/1998 | Robello et al. | 430/270.1 |

*Primary Examiner*—Stephen R. Funk

[57] ABSTRACT

This invention discloses lithographic printing plates having a thin releasable interlayer interposed between a rough and/or porous substrate and a radiation-sensitive layer. The radiation-sensitive layer is bonded to the rough and/or porous substrate through mechanical interlocking. Insertion of a thin releasable interlayer in such a configuration minimizes cross-contamination between the substrate and the radiation-sensitive layer, protects the substrate from attack by environmental species and reduces ink scumming tendency of the plates while still allowing good bonding between the substrate and the radiation-sensitive layer.

38 Claims, 1 Drawing Sheet

LITHOGRAPHIC PRINTING PLATES HAVING A THIN RELEASABLE INTERLAYER OVERLYING A ROUGH SUBSTRATE

FIELD OF THE INVENTION

This invention relates to lithographic printing plates including both wet plates and waterless plates. More particularly, it relates to lithographic printing plate constructions having a thin releasable interlayer interposed between a rough and/or porous substrate and a radiation-sensitive layer, with the radiation-sensitive layer being bonded to the rough and/or porous substrate through mechanical interlocking.

BACKGROUND OF THE INVENTION

Lithographic printing plates (after process) generally consist of ink-receptive areas (image areas) and ink-repelling areas (non-image areas). During printing operation, an ink is preferentially received in the image areas, not in the non-image areas, and then transferred to the surface of a material upon which the image is to be produced. Commonly the ink is transferred to an intermediate material called printing blanket, which in turn transfers the ink to the surface of the material upon which the image is to be produced.

Lithographic printing can be further divided into two general types: wet lithographic printing (conventional lithographic printing) and waterless lithographic printing. In wet lithographic printing plates, the ink-receptive areas consist of oleophilic materials and the ink-repelling areas consist of hydrophilic materials; fountain solution (consisting of primarily water) is required to continuously dampen the hydrophilic materials during printing operation to make the non-image areas oleophobic (ink-repelling). In waterless lithographic printing plates, the ink-receptive areas consist of oleophilic materials and the ink-repelling areas consist of oleophobic materials; no dampening with fountain solution is required.

At the present time, lithographic printing plates (processed) are generally prepared from lithographic printing plate precursors (also commonly called lithographic printing plates) comprising a substrate and a radiation-sensitive coating deposited on the substrate, the substrate and the radiation-sensitive coating having opposite surface properties (such as hydrophilic vs. oleophilic, and oleophobic vs. oleophilic). The radiation-sensitive coating is usually a radiation-sensitive material, which solubilizes or hardens upon exposure to an actinic radiation, optionally with further post-exposure overall treatment. In positive-working systems, the exposed areas become more soluble and can be developed to reveal the underneath substrate. In negative-working systems, the exposed areas become hardened and the non-exposed areas can be developed to reveal the underneath substrate. Conventionally, the actinic radiation is from a lamp (usually an ultraviolet lamp) and the image pattern is generally determined by a photomask (called the film) which is placed between the light source and the plate. With the advance of laser and computer technologies, laser sources have been increasingly used to directly expose a printing plate which is sensitized to a corresponding laser wavelength; photomask is unnecessary in this case. In addition to presensitized plates, press-ready plates can be prepared by direct transferring an external material onto the substrate according to digital imaging information using technologies such as electrophotography (or xerography) and inkjet printing (with or without further curing process), wherein the transferred material and the substrate exhibit substantially opposite surface properties (affinity vs. repellence) for at least one printing liquid selected from the group consisting of ink and an abhesive fluid for ink. For example, for wet plates, the substrate can be hydrophilic and the transferred material can be oleophilic; and for waterless plates, the substrate can be oleophilic and the transferred material can be oleophobic.

One of the more serious problems which can afflict lithographic printing plates is the migration of certain chemical species from the radiation-sensitive layer to the substrate or from the substrate to the radiation-sensitive layer, causing undesirable press performance. For example, in a wet printing plate with hydrophilic substrate, it is well known that migration of chemical species from the radiation-sensitive layer to the substrate can cause loss of hydrophilicity, leading to toning or scumming of the plate (Ink is received in the non-image areas.). In a wet printing plate with silicate coated substrate, migration of certain species (possibly alkaline residues) into the radiation-sensitive layer can effect a certain deterioration of the radiation-sensitive layer during storage (as discussed in U.S. Pat. No. 4,153,461). In addition to migration of chemical species from the radiation-sensitive layer to the substrate, high humidity and other environmental species (such as a solvent or an acid) can also effect the deterioration of the substrate, causing rust or loss of desired surface properties. Chemical reactions between functional groups in the radiation-sensitive layer and functional groups on the substrate at certain conditions (such as higher temperature and humidity) can also lead to undesirable surface properties of the substrate.

For wet printing plates, the above cross-contaminations are especially harmful because of the great propensity for hydrophilic surface to deteriorate. In the manufacture of wet lithographic printing plates, it is well known to coat on the support an insoluble hydrophilic barrier layer which forms the hydrophilic substrate surface of the plate. The barrier layer is utilized primarily to improve the hydrophilicity of the substrate and to minimize contamination and attack of the substrate by chemical species from the radiation-sensitive layer and from the environment. Since such a hydrophilic barrier layer is insoluble in press chemicals, such as fountain solution, ink, developer and press cleaner, it provides consistent hydrophilicity for the background areas of the plates during press operation. Among the various solid materials used for lithographic printing plate supports including metals, plastics and paper, aluminum foil is the most commonly used substrate. For wet lithographic printing plates having an aluminum support, many different materials have been proposed for use in forming such a hydrophilic barrier layer. The hydrophilic barrier layer can be directly applied to the surface of the aluminum sheet material or the aluminum can be grained and/or anodized prior to the application of the hydrophilic coating. Examples of materials useful in forming such hydrophilic coatings are polyvinyl phosphonic acid, polyacrylic acid and polybasic organic acid and their salts, polyacrylamide, copolymers of vinyl phosphonic acid and acrylamide, and silicates. These materials are generally applied to the aluminum surface by dipping the aluminum sheet in a solution of these materials at a certain temperature or by electrochemical deposition, followed by thorough rinse and drying. Hydrophilic coatings which are utilized to form lithographic plate substrate surfaces have been described in various patents, as cited in U.S. Pat. No. 5,368,974 (Walls, et al). Some most representative patents are outlined below.

U.S. Pat. No. 2,714,066 (Jewett, et al) describes formation of an insoluble (i.e., insoluble in fountain solution, ink, developer and press cleaner) hydrophilic layer on aluminum surface through thermal reaction of silicate solution and aluminum surface.

U.S. Pat. No. 3,181,461 (Fromson) describes formation of an insoluble hydrophilic layer on an anodized aluminum surface through thermal reaction of a silicate solution and aluminum oxide coating.

U.S. Pat. No. 3,658,662 (Casson, Jr. et al) describes formation of an insoluble hydrophilic layer on a metal plate through electrochemical anodization in a silicate solution.

U.S. Pat. No. 3,902,976 (Walls) describes formation of an insoluble hydrophilic layer on an aluminum surface by first anodizing the aluminum in an acidic solution to form an aluminum oxide film and then anodizing the oxide film with a silicate solution.

U.S. Pat. No. 4,153,461 (Bergauser, et al) describes formation of an insoluble hydrophilic layer on an anodized aluminum surface through thermal reaction of the aluminum oxide with polyvinyl phosphonic acid.

U.S. Pat. No. 4,399,021 (Gillich, et al) describes formation of an insoluble hydrophilic layer on a metal plate through electrochemical anodization in a water-soluble polybasic organic acid (polyvinyl phosphonic acid being preferred) solution.

U.S. Pat. No. 5,368,974 (Walls, et al) describes formation of an insoluble hydrophilic layer on an aluminum plate through thermal reaction or electrochemical anodization of the aluminum plate with a copolymer of vinyl phosphonic acid and acrylamide.

U.S. Pat. No. 3,860,426 (Cunningham, et al) describes a hydrophilic subbing layer, coated from an aqueous solution of a water-soluble salt of a metal (such as calcium) and a water-soluble hydrophilic cellulosic compound, which is interposed between an anodized aluminum and a radiation-sensitive coating. The anodized aluminum was prepared according to U.S. Pat. No. 3,511,661 (issued May 12, 1970 to Rauner, et al, and disclaimed Oct. 15, 1974). This anodized aluminum surface has micropore openings of about 200 to 750 A and aluminum oxide layer coverage of about 10 to 200 $mg/m^2$, and are anodized from ungrained or mechanically grained aluminum. The interlayer has a coverage of 2 to 15 $mg/ft^2$. According to the patent, "the hydrophilic coating is coated over the porous surface in a subbing amount permitting the peaks of the surface to extend above the coating." Apparently, the hydrophilic interlayer fills the micropores of the anodized aluminum surface and also forms a layer on the surface at a thickness thin enough to allow some surface peaks to extend above the coating.

U.S. Pat. No. 4,427,765 (Mohr) describes coating onto an anodized aluminum base (followed by washing and drying) a complex-type product obtained by reacting a water-soluble organic polymer having acid functional groups containing phosphorus or sulfur with a salt of an at least divalent metal cation, to form an insoluble hydrophilic layer. This insoluble hydrophilic layer is further coated with a radiation-sensitive layer.

Formation of a non-polymeric hydroxy-substituted organic acid interlayer on an anodized metal substrate (followed by washing and drying) before coating a radiation-sensitive layer is described in U.S. Pat. No. 4,467,028 (Huang, et al). According to the patent, "the anodized metal substrate is contacted with the acid solution for a time sufficient to form an interlayer, which is probably little more than a monomolecular layer, on the substrate." Clearly, this interlayer formed on the substrate surface is water-insoluble.

In lithographic printing plates based on silver salt diffusion transfer process comprising a base sheet, an imaging receiving layer having a nucleating agent and a silver halide emulsion layer, incorporation of water-soluble salts into the imaging receiving layer is described in U.S. Pat. No. 3,552,315 (Ormsbee, et al); post-treatment of the anodized aluminum foil with an aqueous solution containing one or more organic compounds having at least one cationic group to improve adhesion between the imaging receiving layer and the aluminum base is described in U.S. Pat. No. 5,633,115 (Jaeger, et al).

A tap water developable lithographic printing plate having a radiation-sensitive water-soluble layer interposed between a hydrophilic substrate and an oleophilic radiation-sensitive layer is described in U.S. Pat. No. 4,104,072 (Golda, et al).

An on-press developable lithographic printing plate having a radiation-sensitive hydrophilic water-insoluble layer between a hydrophilic substrate and an oleophilic radiation-sensitive layer is described in U.S. Pat. Nos. 5,258,263 and 5,407,764 (Cheema, et al).

While the above approaches are beneficial in improving certain aspects of the printing plates, none of the approaches can be used in preparing lithographic printing plates without limitation.

The hydrophilic coatings, with or without radiation-sensitive layers, have limited shelf-life (usually one or two years), will deteriorate prematurely if exposed to extreme environmental conditions such as higher temperature and humidity, or will deteriorate if contacted with certain chemical species. In formulating radiation-sensitive layer, certain otherwise beneficial chemical ingredients (such as epoxy resins) often have to be avoided because of their propensity to cause toning or scumming on these hydrophilic substrates.

In the case of silver halide diffusion transfer lithographic printing plates, the water-soluble salts are either incorporated in the imaging receiving layer or are used as adhesion promoter. Cross-contamination issues are not addressed.

For the plates having a radiation-sensitive water-soluble inner layer or a radiation-sensitive water-insoluble hydrophilic inner layer over-coated with a radiation-sensitive top layer, migration of certain chemical species (such as monomers) of the inner layer to the substrate can cause deterioration of the substrate (such as loss of hydrophilicity).

Therefore, there is a continuing need for improving the stability of the hydrophilic coating, minimizing cross-contamination between the hydrophilic substrate and the radiation-sensitive layer, minimizing deterioration of the substrate by environmental species, better tolerance of the substrate in selecting chemicals for formulating radiation-sensitive layer, and better release capability of the radiation-sensitive coating in non-hardened areas while maintaining good adhesion between the radiation-sensitive layer and the substrate in the hardened areas.

Waterless lithographic printing plate constructions disclosed in the patent literature include plates comprising an oleophilic substrate, a radiation-sensitive interlayer and an oleophobic surface coating, and plates comprising an oleophilic substrate and an oleophobic radiation-sensitive coating. Examples of waterless printing plates with an oleophilic substrate having an oleophobic radiation-sensitive coating thereon are U.S. Pat. Nos. 3,997,349, 4,074,009, and 4,508,814. In waterless printing plates with an oleophilic substrate having an oleophobic radiation-sensitive coating thereon, migration of the oleophobic species in the radiation-sensitive layer to the substrate or incomplete removal of radiation-sensitive layer in the non-hardened areas could lead to poor ink receptivity on the developed substrate. Therefore, there is a need for minimizing cross-contamination between the substrate and the radiation-sensitive layer.

On-press developable lithographic printing plates have been disclosed in the literature. Such plates can be developed on press with ink and/or fountain solution. After exposure, the plates can be directly put on press to be developed during the initial prints and then to print out regular printed sheets. On-press developable plates comprising a substrate, a radiation-sensitive water-insoluble hydrophilic layer and an overlaying radiation-sensitive oleophilic layer are disclosed in U.S. Pat. Nos. 5,258,623 and 5,407,764 (Cheema, et al). On-press developable plates comprising a hydrophilic substrate and an oleophilic radiation-sensitive layer are disclosed in U.S. Pat. No. 5,561,029 (Fitzgerald, et al) and U.S. Pat. No. 5,616,449 (Cheng, et al). On-press developable waterless lithographic plates comprising an oleophilic substrate and an oleophobic radiation-sensitive layer are disclosed in U.S. Pat. No. 3,997,349 (Sanders). Because no regular developer and/or gum solution are used, these plates are more prone to background toning and/or ink scumming. Any deterioration on the substrate will have more harmful effect on these plates than on conventional plates. Therefore, for lithographic printing plates to be developed on press, there is a need to reduce contamination of the substrate by chemical species from the radiation-sensitive layer or from the environment and to improve release capability of the radiation-sensitive layer in non-hardened or solubilized areas.

SUMMARY OF THE INVENTION

It is an object of the present invention to provide a lithographic printing plate construction with reduced cross-contamination or chemical reaction between the substrate and the radiation-sensitive layer, reduced contamination of the substrate from environmental species, improved shelf-life stability, improved clean-up of non-hardened or solubilized areas, improved process latitude, or reduced scumming tendency.

It is another object of this invention to provide a lithographic printing plate construction which allows wider selection of materials for formulating radiation-sensitive layer.

It is another object of this invention to provide a lithographic printing plate which can be developed on a printing press by contact with ink and/or fountain solution (for wet plate) or with ink (for waterless plate) directly after exposure to an actinic radiation.

It is another object of this invention to provide a construction or method for protecting lithographic printing plate substrates from attack by environmental species and for improving the shelf-life stability and process latitude of the substrate.

It is another object of this invention to provide a mechanism for inserting a releasable interlayer (with a certain desired property such as initiation of hydrophilicity, in addition to release capability) between a substrate and a radiation-sensitive layer of a lithographic printing plate while maintaining good adhesion between the substrate and the radiation-sensitive layer.

Further objects, features and advantages of the present invention will become apparent from the detailed description of the preferred embodiments.

According to the present invention, there has been provided a lithographic printing plate comprising in order (a) a substrate with rough and/or porous surface, (b) at least one releasable interlayer and (c) a radiation-sensitive layer having an affinity or aversion substantially opposite to the affinity or aversion of said substrate to at least one printing liquid selected from the group consisting of ink and an abhesive fluid for ink; wherein the substrate surface is rough and/or porous enough and said releasable interlayer (or combination of all releasable interlayers) is thin enough in thickness to allow bonding between said radiation-sensitive layer and said substrate through mechanical interlocking.

According to another aspect of the present invention there has been provided a method for lithographically printing images on a receiving medium, said method comprising: (a) providing a lithographic printing plate as defined above, wherein said radiation-sensitive layer is capable of photo hardening or photo solubilization, and said releasable interlayer and the non-hardened (for negative-working) or solubilized (for positive-working) areas of said radiation-sensitive layer is soluble or dispersible in ink and/or fountain solution (for wet plate) or in ink (for waterless plate); (b) exposing the plate with an actinic radiation to cause hardening or solubilization of the exposed areas; (c) directly placing the exposed plate on a printing press; and (d) operating said printing press to contact said exposed plate with ink and/or fountain solution (for wet plate) or with ink (for waterless plate) to remove the non-hardened or solubilized areas, and to lithographically print images from said plate to the receiving sheets.

According to yet another aspect of the present invention there has been provided a substrate-release layer component, suitable for the manufacture of lithographic printing plates by further depositing a radiation-sensitive layer on the release layer to form a pre-sensitized plate or by imagewise transferring an image-forming material from an external material source onto the release layer to form an imaged plate, comprising (a) a substrate with rough and/or porous surface and (b) at least one release layer deposited on the rough and/or porous surface of the substrate, wherein the substrate surface is rough and/or porous enough and said release layer (or combination of all release layers) is thin enough in thickness that the release layer coated surface remains rough and/or porous enough to allow bonding between a coating to be deposited on the release layer and said substrate through mechanical interlocking.

This invention is based on the principle that, for a component comprising a substrate with rough and/or porous surface, a thin releasable interlayer and a surface coating, good bonding between the substrate and the surface coating can be achieved if the surface is rough and/or porous enough and the interlayer is thin enough to allow mechanical interlocking, even if the interlayer provides no or little adhesion to either the substrate or the surface coating or is dissolved away. Indeed, in my experiments, excellent press durability was achieved with a wet printing plate having a thin water-soluble interlayer between a porous substrate and a radiation-sensitive layer.

DETAILED DESCRIPTION OF THE PREFERRED EMBODIMENTS

A. Plate Constructions

Figure 1:
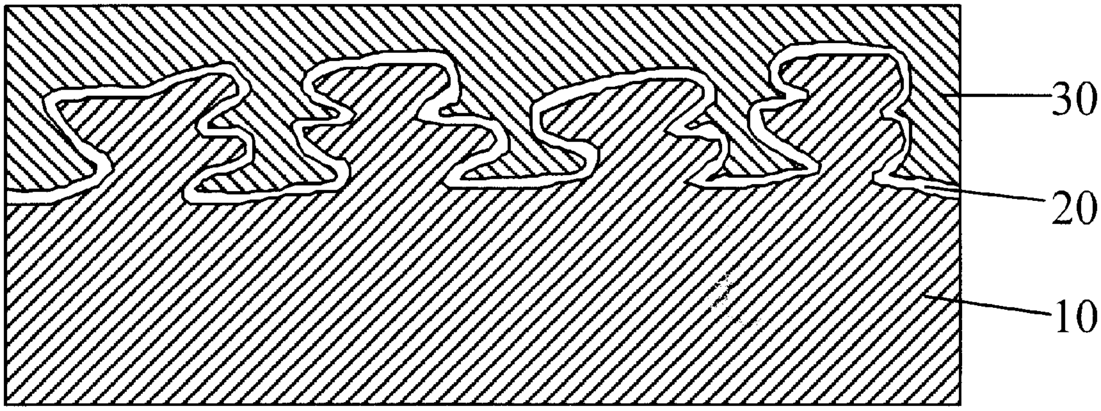
FIG. 1 is a diagrammatic cross-section view of a lithographic printing plate of the invention. The plate consists of a substrate with rough and/or porous surface (10), a thin releasable interlayer (20) and a radiation-sensitive layer (30).

The present invention provides lithographic printing plates (FIG. 1) with a rough and/or porous substrate (10), a releasable interlayer (20), and a radiation-sensitive layer (30) wherein the substrate is rough and/or porous enough and the release layer is thin enough to allow mechanical interlocking between the radiation-sensitive layer and the substrate. The substrate and the radiation-sensitive layer exhibit substantially opposite surface properties (affinity vs. repellence) for at least one printing liquid selected from the group consisting of ink and an abhesive fluid for ink. Here the term "an abhesive fluid for ink" means a fluid which repels or dislikes ink, such as water or fountain solution.

This invention also provides a substrate-release layer component (FIG. 2) comprising a rough and/or porous substrate (10) and a releasable interlayer (20) wherein the substrate is rough and/or porous enough and the release layer is thin enough to allow adhesion between the substrate and a coating to be deposited on the release layer through mechanical interlocking. This substrate-release layer component is suitable for preparing lithographic printing plates by further coating a radiation-sensitive layer or by imagewise transferring an image-forming material onto the release layer.

As is well known, adhesion between a substrate and a coating can be achieved by several mechanisms: mechanical interlocking by which the coating spreads and solidifies in the rough surface of the substrate (voids, pores, holes, crevices, irregular peaks and valleys, and/or fibrous pieces), chemical bonding by which the molecules in the coating form covalent bonding with molecules on the substrate surface, electrostatic attraction such as van der Waals force and hydrogen bonding, and diffusion by which the coating and the substrate form an intermixed layer on the interface. In this invention, the adhesion is primarily achieved by mechanical interlocking.

Mechanical interlocking here means that the coating and the substrate surface structures are mechanically locked (or held) to each other and are incapable of separation without deforming or breaking the coating or the substrate surface structures. In order for a plate substrate to have mechanical interlocking with a coating deposited on it, the substrate surface must have certain rough and/or porous structures (such as voids, pores, holes, crevices, irregular peaks and valleys, and/or fibrous pieces) which are capable of mechanical interlocking. Examples of substrate surface structures capable of mechanical interlocking include (i) peaks and valleys having secondary (usually smaller) peaks and valleys along the slopes, (ii) pores or holes having larger diameter inside than near the surface, (iii) peaks having larger diameter near the top than near the bottom, and (iv) regular or irregular posts or pores tilted away from straight up direction. Examples of substrate surface structures incapable of mechanical interlocking include smooth peaks and valleys (with top of peaks being smaller than bottom).

In this invention, any substrate with surface structures capable of mechanical interlocking can be used. Preferred substrate surface structures include irregular peaks, valleys, holes, and pores that are capable of mechanical interlocking with a coating deposited thereon. The releasable interlayer (or called release layer) should be substantially conformally coated on the microscopic surfaces of the substrate surface structures and should be thin enough in thickness so that, the releasable interlayer coated substrate has microscopic surface profiles similar to those of the substrate, and a coating on the releasable interlayer is capable of bonding to the substrate through mechanical interlocking. In other words, a coating on the releasable interlayer is incapable of being removed without deforming or breaking the coating or the substrate surface structures even if the releasable interlayer is dissolved away. A radiation-sensitive layer can be further coated on the releasable interlayer to form a lithographic plate. The radiation-sensitive layer usually is coated at a thickness which is at least thick enough to substantially fill the pores and valleys on the releasable interlayer coated substrate surface.

FIG. 1 illustrates a cross-section view of a lithographic printing plate in a primary embodiment of the invention. The plate consists of a substrate with rough and/or porous surface (10) capable of mechanical interlocking with a coating deposited thereon, a releasable interlayer (20) that is substantially conformally coated on the microscopic surfaces of the substrate surface structures so that the releasable interlayer coated substrate has microscopic surface profiles similar to those of the substrate, and a radiation-sensitive layer (30) on the releasable interlayer. The radiation-sensitive layer on the releasable interlayer is capable of bonding to the substrate through mechanical interlocking (and is therefore incapable of being removed without deforming or breaking the radiation-sensitive layer or the substrate surface structures) even if the releasable interlayer is dissolved away. As in any lithographic printing plates, the radiation-sensitive layer exhibits an affinity or aversion substantially opposite to the affinity or aversion of the substrate to at least one printing liquid selected from the group consisting of ink and an abhesive fluid for ink.

Figure 2:
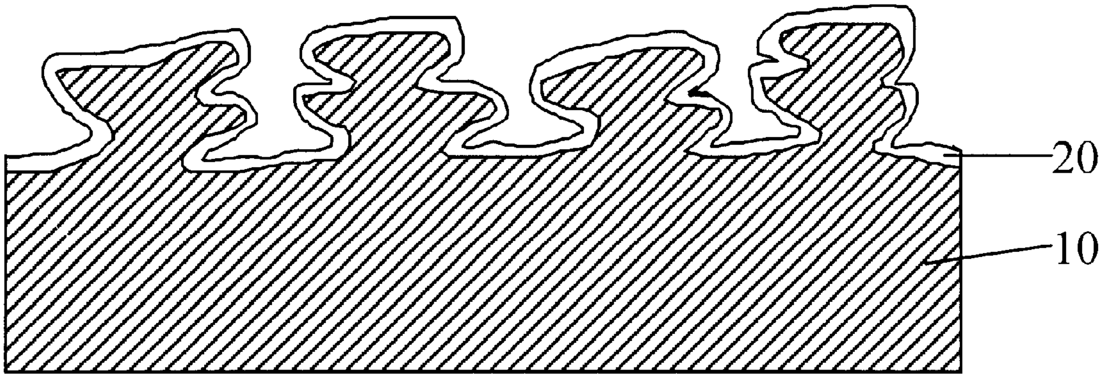
FIG. 2 is a diagrammatic cross-section view of a substrate-release layer component, which can be used for the manufacture of lithographic printing plates by further coating a radiation-sensitive layer or imagewise transferring an external material onto the release layer (20).

FIG. 2 illustrates a cross-section view of a substrate-release layer component in a primary embodiment of the invention. The substrate-release layer component consists of a substrate with rough and/or porous surface (10) capable of mechanical interlocking with a coating deposited thereon, and a release layer (20) that is substantially conformally coated on the microscopic surfaces of the substrate surface structures and is thin enough in thickness so that the release layer coated substrate has microscopic surface profiles similar to those of the substrate. A coating to be deposited on the release layer is capable of bonding to the substrate through mechanical interlocking (and is therefore incapable of being removed without deforming or breaking the coating or the substrate surface structures) even if the release layer is dissolved away. Such a substrate-release layer component can be used for the manufacture of lithographic printing plates by further depositing a radiation-sensitive layer or imagewise transferring an external material onto the release layer.

Lithographic printing plate constructions covered in this invention include, but are not limited to, (a) a wet plate with a hydrophilic substrate, a releasable interlayer and an oleophilic radiation-sensitive layer; (b) a wet plate with an oleophilic substrate, a releasable interlayer and a hydrophilic radiation-sensitive layer; (c) a waterless plate with an oleophilic substrate, a releasable interlayer and an oleophobic radiation-sensitive layer; and (d) a waterless plate with an oleophobic substrate, a releasable interlayer and an oleophilic radiation-sensitive layer. A preferred wet plate consists of a hydrophilic substrate, a releasable interlayer and an oleophilic radiation-sensitive layer. A preferred waterless lithographic printing plate consists of an oleophilic substrate, a releasable interlayer and an oleophobic radiation-sensitive layer. More than one radiation-sensitive layers or additional layers above the radiation-sensitive layer may be coated to obtain certain benefits, as is well known in the art. For example, a plate may comprise a diazo type radiation-sensitive inner layer and an acrylic type radiation-sensitive outer layer to improve durability.

A water-soluble or water-dispersible, non-radiation-sensitive overcoat may be further coated on top of the radiation-sensitive layer to retard oxygen inhibition, to provide surface durability (such as scratch resistance and non-tackiness), and/or to reduce contamination of the radiation sensitive layer by dust, finger prints, press room chemicals, and other substances. Suitable overcoat materials include water-soluble polymers, such as polyvinyl alcohol, polyethylene glycol; and water-dispersible materials, such as polyethylene particles dispersed in polyvinyl alcohol continuous phase. Surfactant and other additives may be added to facilitate the coating and/or development process. Such an overcoat may be developed off during regular press development process or, for on-press developable plates, may be developed off by fountain solution and/or ink. Commercial application of overcoat on conventional plates is well known. Examples of such overcoats are described in U.S. Pat. Nos. 5,286,594 (Sypek, et al), 5,516,620 (Cheng, et al) and 5,677,110 (Chia, et al), and references noted therein.

A laser imagable layer, capable of transforming into a negative or positive mask through optical density change or ablation upon a certain imagewise laser irradiation, may be further coated onto the radiation-sensitive (such as UV-sensitive) layer. The top laser imagable layer should be sensitive to a certain radiation (wavelength) to which the regular radiation-sensitive layer is not sensitive. This top laser imagable layer forms the negative or positive mask upon imagewise laser irradiation at a certain wavelength which does not effect the regular radiation-sensitive layer. The laser imaged plate is further flood exposed with a radiation (such as UV light) to either harden (for negative-working plate) or solubilize (for positive-working plate) the regular radiation-sensitive layer. Application of such a top layer capable of forming a photomask in printing plates is well known in the art. Examples of such a photomask-forming layer are described in U.S. Pat. No. 4,132,168 (Peterson).

A negative or positive photomask can also be deposited on the plates having a photohardenable or photosolubilizable radiation-sensitive layer by imagewise transferring onto the radiation-sensitive layer a non-transparent material from an external material source. Useful methods for such mass-transfer include, for example, inkjet printing, electrophotographic process, and laser ablation transfer. After imagewise mass-transferring a photomask-forming material from an external source to form a photomask on the radiation-sensitive layer, the plate can be flood exposed with an actinic radiation (without using a separate photomask) to harden or solubilize the radiation-sensitive layer under the transparent areas of the photomask. The exposed plate can be further processed (if necessary) and then put on press for printing.

In addition to forming a pre-sensitized plate comprising a rough and/or porous substrate, a releasable interlayer and a radiation-sensitive layer, lithographic printing plates can also be made by imagewise transferring onto the substrate-release layer component a certain material from an external source through a certain process, such as inkjet printing, electrophotography (such as conventional Xerox copying and laser Xerox printing) and laser ablation transfer. The externally transferred material should exhibit an affinity or aversion substantially opposite to the affinity or aversion of the substrate to at least one printing liquid selected from the group consisting of ink and an abhesive fluid for ink. The transferred material can be thermally and/or radiation curable and the imaged plate can be cured by a thermal and/or radiation curing process. Direct transfer of an imaging material onto a hydrophilic substrate through inkjet, electrophotography or laser ablation is well known. Examples of preparing lithographic printing plates through inkjet, electrophotography and laser ablation transfer processes can be found in U.S. Pat. Nos. 5,501,150 (Leeners, et al), 5,620,822 (Kato, et al), and 3,964,389 (Peterson), respectively. In the current invention, the release layer coated on the substrate will help protect the substrate from physical or chemical contamination or damage during the storage and handling of the substrate-release layer component and during the imaging, curing, and/or other post-imaging processes of the plate.

B. Substrate

The printing plate substrate is preferably mechanically strong, hard, durable, and relatively flexible in order to be able to stand the press operation, and may be a metal sheet, a polymer film, or a coated paper. Examples of suitable metals include aluminum, zinc, steel, copper and their alloys. Aluminum (including aluminum alloys) is a preferred metal. Examples of suitable polymers include polyesters, polyimides, polyacrylates, cured epoxy resins. These substrate sheets or films are usually used as the sole support of the plate in addition to providing surface functions. However, they may be laminated onto another sheet-like material, such as a paper, a polymer film, or a metal sheet to obtain better strength or to minimize the usage of a more expensive substrate material. For example, an aluminum foil (providing a substrate surface) may be laminated onto a paper to reduce the more expensive aluminum usage. A cured epoxy resin (providing a substrate surface) may be laminated onto a paper to obtain better dimensional stability and lower cost.

The substrate surface must be rough and/or porous enough so that a coating deposited thereon can have adhesion to the substrate through mechanical interlocking. For metals, a rough and/or porous surface can be achieved by mechanical graining or brushing, chemical etching, and/or AC electrochemical graining. AC Electrochemical graining generally gives the best results (in terms of mechanical interlocking). Surface oxidation or crystal growth may be used to prepare a rough and/or porous surface. Examples of metal surface graining (or roughening) can be found in U.S. Pat. Nos. 3,072,546, 3,073,756, 4,477,317, 4,735,696, 5,122,242, and 5,186,795. Examples of surface oxidation and crystal growth on metals to form roughened surface can be found in U.S. Pat. Nos. 4,642,161 and 4,717,439. For polymer (or plastics) film, chemical etching or mechanical roughening may be used to create a rough and/or porous surface. Chemical etching has been widely used in plastics substrate roughening for metal plating on plastics. Examples of plastics surface roughening by chemical etching can be found in U.S. Pat. Nos. 3,962,496, 4,042,729, 4,086,128, 4,820,548 and 5,332,465.

After surface roughening, depending on the surface requirement (such as surface affinity, durability, and barrier properties), the substrate can be directly used to coat a releasable interlayer or can be treated to form a substrate surface layer before coating a releasable interlayer. The substrate surface layer is usually permanently bonded to the substrate and becomes a part of the substrate. Therefore, the substrate surface layer coated substrate should still satisfy the requirement of the current invention that the surface roughness and/or porosity is high enough to allow interlocking between the substrate surface layer coated substrate and a coating to be deposited on the substrate. For aluminum substrate in wet plate application, the roughened surface can be further anodized to form a durable aluminum oxide surface using an acid electrolyte such as sulfuric acid and/or phosphoric acid. The roughened or roughened and anodized aluminum surface can be further thermally or electrochemically coated with a layer of silicate or hydrophilic polymer such as polyvinyl phosphonic acid, polyacrylamide, polyacrylic acid, polybasic organic acid, copolymers of vinyl phosphonic acid and acrylamide to form a durable hydrophilic layer. Polyvinyl phosphonic acid and its copolymers are preferred polymers. Processes for coating a hydrophilic barrier layer on aluminum in lithographic printing plate application are well known in the art, and examples can be found in U.S. Pat. Nos. 2,714,066, 4,153,461, 4,399,021, and 5,368,974. For plastics as well as metals with roughened substrate surface, a durable hydrophilic coating may be deposited to render the surface hydrophilic. An example can be found in U.S. Pat. No. 5,629,088 (Ogawa et al), in which a durable hydrophilic film is formed on and covalently bonded to the surface of a substrate including metals, glass, plastics and the like containing hydroxy or imino groups on the surface.

For waterless plates with oleophilic substrate surface, the roughened metals or most polymer films can be directly used as oleophilic substrate or can be further coated with an oleophilic coating. Metals and metal oxides when not dampened generally exhibit oleophilicity (as well as hydrophilicity). Most polymers, such as polyacrylates, polystyrene, polyethylene terephthalate, polyurethanes and epoxy resins, are generally oleophilic. However, a thin layer of more oleophilic polymeric coating deposited on the rough and porous surface can improve the oleophilicity of the substrate. Suitable materials for preparing oleophilic coating for waterless plate substrate include non-crosslinkable polymers such as polystyrene, acrylic polymers (such as polymethylmethacrylate), polyvinyl acetate, polyvinyl chloride and nitrocellulose, and crosslinkable polymeric resins such as epoxy-amine system, melamine formaldehydehydroxy polymer system and isocyanate-hydroxy polymer system. Crosslinkable polymeric coatings are preferred because of their excellent chemical resistance after curing.

The rough and/or porous substrate surface may have various structure, as long as it allows mechanical interlocking between the substrate and a coating deposited thereon. The roughness of a surface can be expressed as average surface roughness Ra which is the average deviation of the "peaks" and "valleys" from the centerline and is also called arithmetical roughness average. Clearly, higher surface roughness does not necessarily allow mechanical interlocking between the substrate and a coating deposited thereon (A surface with high Ra may have no mechanical interlocking to a surface coating at all.). However, for the rough and/or porous surfaces generated by certain processes, such as electrochemical and chemical grainings, higher Ra usually correlates to higher porosity and gives higher mechanical interlocking to a surface coating. While the interlocking is not determined by Ra alone and there is no intention in this invention to limit the Ra of the substrate, generally the substrate can have an average surface roughness Ra of about 0.2 to about 2.0 micrometer, and preferably about 0.4 to about 1.0 micrometer.

C. Radiation-Sensitive Layer

A wide variety of radiation-sensitive materials suitable for forming images for use in the lithographic printing process are known. For preparing printing plates of the current invention, any radiation-sensitive layer is suitable which is capable of hardening or solubilization in the exposed areas (and not in the unexposed areas) upon exposure to a radiation and any necessary overall treatment (including heating, chemical treatment or overall exposure with a different radiation). Here hardening means becoming insoluble in a developer (negative-working) and solubilization means becoming soluble in a developer (positive-working). For on-press developable plates, the developer can be ink and/or fountain solution. The radiation can be a conventional light source, such as a high pressure mercury lamp, a xenon lamp, or a fluorescence lamp (usually requiring a mask), or can be a laser source which directly images according to digital imaging information.

Radiation-sensitive materials useful in negative-working wet plates include silver halide emulsions, as described in U.S. Pat. No. 5,620,829 (Deprez) and references noted therein; polycondensation products of diazonium salts, as described in U.S. Pat. Nos. 3,679,416 (Gillich, et al), 3,867,147 (Teuscher), and 4,631,245 (Pawlowski) and references noted therein; compositions comprising acrylic monomers, polymeric binders, and photoinitiators, as described in U.S. Pat. Nos. 5,407,764 (Cheema, et al) and 4,772,538 (Walls, et al) and references noted therein; light-sensitive compositions comprising polyfunctional vinyl ethers or epoxy monomers, and cationic photoinitiators, as described in U.S. Pat. Nos. 4,593,052 (Irving) and 4,624,912 (Zweifel, et al) and references noted therein; cinnamal-malonic acids and functional equivalents thereof and others described in U.S. Pat. No. 3,342,601 (Houle, et al) and references noted therein; dual layer light sensitive materials described in U.S. Pat. No. 5,476,754 (Imai, et al); and compositions sensitized to both conventional ultraviolet and infrared laser radiations, as described in U.S. Pat. No. 5,491,046 (DeBoer et al) and references noted therein.

Radiation-sensitive materials useful in positive-working wet plates include diazo-oxide compounds such as benzoquinone diazides and naphthoquinone diazides, as described in U.S. Pat. No. 4,141,733 (Guild) and references noted therein; and compositions comprising a photo acid generator and a polymer having acid labile groups, as described in U.S. Pat. No. 5,395,734 (Vogel) and references noted therein.

Radiation-sensitive oleophobic materials useful in waterless plates include compositions comprising polymers having perfluoroalkyl groups and crosslinkable terminal groups, as described in U.S. Pat. Nos. 4,074,009 (Sanders) and 5,370,906 (Dankert) and references therein; compositions comprising polysiloxane and crosslinkable resins, as described in U.S. Pat. No. 4,259,905 (Abiko) and references therein; and compositions comprising a diazonium salt and an adhesive acid or salt thereof, as described in U.S. Pat. No. 3,997,349 (Sanders) and references noted therein.

It is noted that lithographic printing plates suitable for exposure with a conventional actinic light source through a photo mask can also be directly imagewise exposed with a laser having similar actinic wavelength. Because of the easy availability of certain visible and infrared lasers, such as argon laser (488 nm), frequency-doubled Nd/YAG laser (532 nm), diode laser (830 nm) and Nd/YAG laser (1064 nm), plates for laser imaging are often sensitized to the wavelength of one of these lasers. For example, some visible light sensitive initiators, such as Irgacure 784 (a free-radical initiator with strong absorption from 400 to 535 nm, from Ciba Geigy), can be used to formulate into the radiation-sensitive layer to make the plate imagable with argon laser or frequency-doubled Nd/YAG laser; an acid crosslinkable radiation-sensitive layer with addition of an infrared dye having strong absorption at about 830 nm and a thermo-sensitive latent Bronsted acid can be exposed with diode laser (usually followed by thermal treatment) to cause hardening in the exposed areas. Examples of such radiation-sensitive layers can be found in U.S. Pat. Nos. 4,486,529 (Jeffers, et al), 5,663,037 (Haley, et al), 5,491,046 (DeBoer, et al) and 5,641,608 (Grunwald et al), and references noted therein.

The mechanisms for the photohardening or photosolubilization of radiation-sensitive materials may be different for different radiation-sensitive materials and the imaging radiation. For example, a certain radiation can directly cause hardening or solubilization of a certain molecule; a certain radiation can activate a certain initiator (and/or coinitiator or sensitizer) which in turn causes hardening or solubilization of a certain molecule; and a certain radiation (usually an infrared light) can be absorbed by a absorbing dye or pigment to generate heat which heat in turn indirectly (through an initiator) or directly causes hardening or solubilization of a certain molecule. It is noted that, in order to clarify and simplify the terminology of this patent, in this patent, any radiation which can directly or indirectly cause hardening or solubilization of a radiation-sensitive material is defined as actinic radiation for that radiation-sensitive material. Such a radiation can be a conventional light or laser.

In a preferred embodiment as for negative-working wet lithographic printing plates of this invention, the radiation-sensitive layer comprises at least one polymeric binder (with or without ethylenic functionality), at least one photopolymerizable ethylenically unsaturated monomer (or oligomer) having at least one terminal ethylenic group capable of forming a polymer by free-radical polymerization, at least one radiation-sensitive free-radical initiator (including sensitizer), and other additives such as surfactant, dye or pigment, radiation exposure-indicating dye (such as leuco crystal violet, azobenzene, 4-phenylazodiphenylamine, and methylene blue dyes), and free-radical stabilizer (such as methoxyhydroquinone). Suitable polymeric binders include polystyrene, acrylic polymers and copolymers (such as polybutylmethacrylate, polyethylmethacrylate, polymethylmethacrylate, polymethylacrylate, butylmethacrylate/methylmethacrylate copolymer), polyvinyl acetate, polyvinyl chloride, styrene/acrylonitrile copolymer, nitrocellulose, cellulose acetate butyrate, cellulose acetate propionate, vinyl chloride/vinyl acetate copolymer, partially hydrolyzed polyvinyl acetate, polyvinyl alcohol partially condensation-reacted with acetaldehye, and butadiene/acrylonitrile copolymer. Suitable free-radical polymerizable monomers (including oligomers) include multifunctional acrylate monomers or oligomers, such as acrylate and methacrylate esters of ethylene glycol, trimethylolpropane, pentaerythritol, ethoxylated ethylene glycol and ethoxylated trimethylolpropane, multifunctional urethanated acrylate and methacrylate (such as Sartomer CN970 and CN975 from Sartomer Company, Exton, Pa.), and epoxylated acrylate or methacrylate (such as Sartomer CN104 and CN120 from Sartomer Company, Exton, Pa.), and oligomeric amine diacrylates. Suitable radiation-sensitive free-radical initiators include the derivatives of acetophenone (such as 2,2-dimethoxy-2-phenylacetophenone, and 2-methyl-1-[4-(methylthio) phenyl]-2-morpholino propan-1-one), benzophenone, benzil, ketocoumarin (such as 3-benzoyl-7-methoxy coumarin and 7-methoxy coumarin), xanthone, thioxanthone, benzoin or an alkyl-substituted anthraquinone, s-triazine, and titanocene(bis($\eta^9$-2,4-cyclopentadien-1-yl), bis[2,6-difluoro-3-(1H-pyrrol-1-yl)phenyl)titanium).

In a second preferred embodiment as for negative-working wet lithographic printing plates of this invention, the radiation-sensitive layer comprises a polycondensation product of diazonium salt (diazo resin), with or without a polymeric binder, and other additives such as colorants, stabilizers, exposure indicators, surfactants and the like. Particularly useful diazo resins include, for example, the condensation product of p-diazodiphenylamine and formaldehyde, the condensation product of 3-methoxy-4-diazodiphenylamine and formaldehyde, and the diazo resins of U.S. Pat. No. 3,867,147 (Teuscher), U.S. Pat. No. 4,631,245 (Pawlowski) and U.S. Pat. No. 5,476,754 (Imai, et al), and references noted therein. Particularly useful polymeric binders for use with such diazo resins include, for examples, acetal polymers and their derivatives as described in U.S. Pat. Nos. 4,652,604, 4,741,985, 4,940,646, 5,169,897 and 5,169,898 and references noted therein; and polymeric binders with carboxylic acid groups, as described in U.S. Pat. No. 4,631,245.

In another preferred embodiment as for negative-working wet lithographic printing plates of this invention, the radiation-sensitive layer comprises at least one polyfunctional vinyl ether or epoxy monomer (or oligomer), at least one cationic photoinitiator (including sensitizer), optionally one or more polymeric binders, and other additives such as colorants, stabilizers, exposure indicators, surfactants and the like. Examples of useful polyfunctional epoxy monomers are 3,4-epoxycyclohexylmethyl-3,4-epoxycyclohexane carboxylate, bis-(3,4-epoxycyclohexymethyl) adipate, difunctional bisphenol A/epichlorohydrin epoxy resin and multifunctional epichlorohydrin/tetraphenylol ethane epoxy resin. Examples of useful cationic photoinitiators are triarylsulfonium hexafluoroantimonate and triarylsulfonium hexafluorophosphate. Examples of useful polymeric binders are polybutylmethacrylate, polymethylmethacrylate and cellulose acetate butyrate.

D. Releasable Interlayer

A wide variety of solid materials, which are soluble or dispersible in a solvent or solution that does not cause substantially harmful effect on either the radiation-sensitive layer or the substrate, can be used to prepare a releasable interlayer. Such a solvent or solution can be, at least, water, ink, fountain solution, an aqueous or solvent plate developer, an organic solvent, or a press cleaner. The releasable interlayer can be coated through various coating methods, such as slot coating, roller coating, curtain coating, dip coating, and spray coating from a dilute solution of these materials. Vacuum vapor deposition or sputtering coating may be used to form a releasable interlayer for lower molecular weight materials.

The plates disclosed in this invention usually only contain one releasable interlayer, but multiple releasable interlayers may be used. For example, the first releasable interlayer deposited on the substrate may be a water-soluble polymer layer and the second releasable interlayer deposited thereon may be a radiation-absorbing layer such as a metal layer or a coating containing a dye or pigment. The first and second releasable interlayers may require different release agents or release processes. For example, if the release agent or release process for the outer releasable interlayer is harmful to the substrate, the inner releasable interlayer can provide protection for the substrate during the release process of the outer releasable interlayer and can then be cleaned off with a different release agent which is not harmful to the substrate. For plates having more than one releasable interlayers, the total thickness of the releasable interlayers combined should be thin enough to satisfy the requirement that mechanical interlocking between the radiation-sensitive coating and the rough and/or porous substrate exists.

In a preferred embodiment of the invention, the releasable interlayer comprises a water-soluble polymer. Suitable water-soluble polymers include, for example, polyvinyl alcohol (including various water-soluble derivatives of polyvinyl alcohol), polyvinylpyrrolidone, poly(2-ethyl-2-oxazoline), polyethylene glycol, polypropylene glycol, ethylene glycol/propylene glycol copolymer, and gum Arabic. It is noted that commercially polyvinyl alcohol is usually prepared by first polymerizing an ester derivative of vinyl alcohol (such as vinyl acetate) and then hydrolyzing the polyvinyl alcohol ester (such as polyvinyl acetate). The degree of hydrolysis varies for different products. For example, Airvol 540, Airvol 425, and Airvol 125 have degrees of hydrolysis of about 88%, 96%, and 99.3%, respectively. Therefore, the term polyvinyl alcohol used in this patent refers to all the partially and fully hydrolyzed polyvinyl alcohols which are water-soluble.

Suitable ink- or organic solvent-soluble materials for releasable interlayer include, for example, acrylate (including methacrylate) polymers, polystyrene, polyvinyl acetate, styrene/acrylonitrile copolymer, nitrocellulose, cellulose acetate butyrate, cellulose acetate propionate and styrene/maleic anhydride copolymer.

While various acid functional polymers have been used to thermochemically or electrochemically form an insoluble hydrophilic layer on the substrate for printing plates as disclosed in the patent literature (for example, U.S. Pat. No. 4,399,021), these polymers may also be used (without insolubilization) as a releasable interlayer according to this invention. Such polymers can be coated onto the substrate surface (including substrate with an insolubilized acid functional polymer layer) without thermal or electrochemical treatment and further rinse. Useful acid functional polymers include polyvinyl phosphonic acid, polybasic acid, polyacrylic acid, polysulfonic acid, and polyacrylamide. Various chemicals capable of enhancing the hydrophilicity of the substrate, such as gum arabic and certain surfactants, can be used to formulate the release layer in a wet plate to enhance hydrophilicity in addition to helping the clean-up of the non-image areas.

For a plate with substrate and radiation-sensitive layer being resistant to a certain alkaline solution or etchant, certain alkaline-soluble or etchable materials may be used for releasable interlayer. Suitable alkaline-soluble polymers include styrene/maleic anhydride copolymer and its derivatives, polyacrylates (including methacrylates) with acid number of higher than about 80 mg KOH/g, and other carboxylic acid functional polymers. Suitable etchable materials include various etchable metals, such as iron, copper and aluminum. Such metals can be deposited onto the substrate surface by, for example, vacuum deposition or plating. Suitable etching solutions may include, for example, aqueous solution of iron (II) chloride and hydrochloric acid (for iron), aqueous solution of copper (I) chloride and hydrochloric acid (for copper), and sodium hydroxide (for aluminum).

Usually, the releasable interlayer is substantially uniform and spreads over the whole substrate surface. However, the interlayer can also be discontinuous, with some areas not being covered, due to imperfection in manufacture or by design. It is not hard to understand that plates with discontinuous releasable interlayer can still provide certain advantages over plates without releasable interlayer at all, such as better release and gumming properties.

Various additives may be added into the releasable interlayer to improve the coating or release properties of the releasable interlayer or to provide other desired properties for the plate, such as barrier property, reflection or antireflection (whichever is desirable), color, or exposure indication. For release layer deposited from a solution or dispersion, various additives, such as surfactant, wetting agent, defoamer, leveling agent, and dispersing agent, can be added into the releasable interlayer formulation to facilitate, for example, the coating or release process of the releasable interlayer or the plate development process. Imaging radiation-absorbing dye or pigment (including carbon black) may be added into the releasable interlayer to reduce reflection and scattering of imaging radiation (to allow sharper image or better resolution). A visible dye or pigment may be added into the releasable interlayer to provide color contrast between the developed and the non-developed areas. An exposure color indicator may be added into the releasable interlayer to provide color contrast between the exposed and the non-exposed areas.

The coverage of the releasable interlayer may vary depending on the roughness and porosity of the substrate surface and the performance requirement of the plate, as long as the releasable interlayer is thin enough to allow mechanical interlocking between the radiation-sensitive layer and the substrate. The releasable interlayer may be coated at an average coverage of about 1 to about 200 $mg/m^2$, preferably about 4 to about 40 $mg/m^2$. The coating coverage ($mg/m^2$) is defined as the total weight of the dried coating (mg) per given coated substrate sheet area ($m^2$). It is noted that here the area is measured as the substrate sheet dimension (length by width), not the microscopic surface area.

E. On-Press Developable Plates

In wet lithographic printing plates, a water-soluble or -dispersible interlayer between a hydrophilic rough and/or porous substrate and an oleophilic radiation-sensitive layer can improve the initial hydrophilicity of the substrate, in addition to improving release capability and protecting the substrate. Therefore, plates comprising a hydrophilic substrate, a water-soluble or -dispersible interlayer, and an ink and/or fountain solution-soluble or -dispersible radiation-sensitive layer (in non-hardened or solubilized areas) can be developed on a wet lithographic press directly after exposure. The plate can be developed on press with ink and/or fountain solution for the initial prints and then produce good prints. Suitable compositions for preparing water-soluble or -dispersible interlayer include, for example, water-soluble polymers such as polyvinyl alcohol (optionally with addition of surfactants).

In waterless lithographic printing plates, insertion of an ink-soluble or -dispersible interlayer between a rough and/or porous substrate and a radiation-sensitive layer can help the development of the non-hardened or solubilized areas. Therefore waterless plates comprising a substrate, an ink-soluble or -dispersible interlayer and an ink-soluble or -dispersible radiation-sensitive layer (in non-hardened or solubilized areas) can be developed on a waterless press directly after exposure. The plate can be developed on the press with ink for the initial prints and then produce good prints. Suitable materials for preparing ink-soluble or -dispersible interlayer include, for example, ink-soluble polymers such as polystyrene, polyvinyl acetate, nitrocellulose, and cellulose acetate butyrate.

It is noted that plates designed for on-press development can also be developed with a conventional process using a suitable solvent or aqueous developer. The plates disclosed in this invention include on-press developable plates as well as plates which are intended for other development process.

The invention is further illustrated by the following examples of its practice. Unless specified, all the values are by weight.

EXAMPLE 1

Two aluminum sheets (3 in.×6 in.×0.005 in.) were degreased in an aqueous alkaline detergent solution for 4 min. and rinsed with running water for 60 sec. The degreased aluminum sheets were then placed face-to-face at 2 inches apart in a 1.0% hydrochloric acid aqueous solution. Each aluminum sheet was connected to one of the two outputs of AC electric source. AC current of about 8 Ampere (at about 80 Volt) was passed through for 30 sec. The sheets were then rinsed with running water for 60 sec. and dried with forced hot air. The AC electrochemically grained aluminum sheets showed uniformly grained surface, with dull, gray-colored appearance, in contrast to the original shining surface. Under microscope, the grained aluminum sheets showed graineous and porous surface.

The electrochemically grained aluminum sheets were immersed in an aqueous solution of 0.1% polyvinyl phosphonic acid at 60° C. for 4 min., followed by rinse with running water for 60 sec. and drying in an oven at 100° C. for 4 min.

The polyvinyl phosphonic acid thermally treated aluminum sheets were coated with an aqueous solution of 0.1% polyvinyl alcohol (RL-1) using a #5 Meyer rod (wire-round rod), followed by drying at 100° C. for 6 min.

| Formulation RL-1 | Weight (g) |
|---|---|
| Airvol 540 (from Air Products and Chemicals Inc.) | 0.10 |
| Water | 100.0 |

The polyvinyl alcohol coated aluminum sheets were further coated using a #5 Meyer rod with the following radiation-sensitive formulation (PS-1):

| Formulation PS-1 | Weight (g) |
|---|---|
| Neocryl B-728 polymer (from Zeneca) | 16.02 |
| Ebecryl RX8301 oligomer (from UCB Chemicals) | 3.21 |
| Sartomer SR-399 monomer (from Sartomer) | 20.04 |
| Irgacure 907 initiator (from Ciba-Geigy) | 1.60 |
| Isopropyl thioxanthone (Sensitizer) | 0.80 |
| Methoxyether hydroquinone (Antioxidant) | 0.04 |
| Irganox 1035 antioxidant (from Ciba Geigy) | 0.04 |
| Orasol Blue GN dye (from Ciba Geigy) | 0.32 |
| Leuco crystal violet (Exposure indicator) | 0.32 |
| Pluronic L43 (from BASF) | 1.60 |
| Cyclohexanone | 40.0 |
| Methylethylketone | 360.0 |

The radiation-sensitive formulation coated plates were dried immediately with forced hot air. Several sets of plates were prepared to be used for tests at different conditions.

A fresh plate prepared above was placed under a UGRA target mask in a vacuum frame and exposed to a UV light with an emission peak at about 364 nm for 5 min. (to achieve a Stouffer step of about 4 in a 21-step Stouffer sensitivity guide). The exposed plate was subjected to hand test for on-press developability. The plate was rubbed 10 times with a cloth damped with both fountain solution (prepared from Superlene Brand All Purpose Fountain Solution Concentrate made by Varn, Oakland, N.J.) and ink (Sprinks 700 Acrylic Black ink from Sprinks Ink, Florida) to check on-press developability and inking; additional 200 rubs were performed to check the durability of the plate. The developed plate showed good imaging, clean background, and good durability (no wearing off at 200 rubs).

A second sample exposed as above was tested for conventional development with isopropanol as developer. About 50 grams of isopropanol was poured on the plate and was spread across the whole plate with a cloth. The dissolved radiation-sensitive layer was wiped off with the cloth. The plate was further cleaned by wiping with a clean cloth and additional isopropanol. The developed plate was wiped with a gum arabic solution (from Varn, Oakland, N.J.) and then tested for inking by spraying with fountain solution and rubbing with a cloth damped with both fountain solution and ink for 10 times. Additional 200 rubs were performed to check the durability of the plate. This solvent-developed plate also showed good imaging, clean background, and good durability (no wearing off at 200 rubs).

To test the shelf-life stability by accelerated aging, the plate prepared above was heated at 120° F. for 7 days and then hand tested for developability, inking, and durability. Good imaging, clean background, and good durability were observed when developed with fountain solution and ink or developed with solvent.

To test the humidity sensitivity, the plate prepared above was placed vertically in a sealed glass container with 100% humidity and 100° F. temperature inside for 3 days and then hand tested for developability, inking, and durability. Good imaging, clean background, and good durability were observed when developed with fountain solution and ink or developed with solvent.

The plate prepared above was hand tested after storing at room temperature for 6 months. Good imaging, clean background, and good durability were observed when developed with fountain solution and ink or developed with solvent.

EXAMPLE 2

Comparative Example for EXAMPLE 1

Plates were prepared according to the above procedure and composition except that no polyvinyl alcohol interlayer was coated (The radiation-sensitive layer was directly coated onto the polyvinyl phosphonic acid treated substrate.). The same tests as in EXAMPLE 1 were performed.

The fresh plates showed good imaging, clean background, and good durability (no wearing off at 200 rubs) when developed with ink and fountain solution. However, after aged at room temperature for 3 months, the plate developed with ink and fountain solution showed background toning. On accelerated aging tests, the plates showed background ink scumming after conditioned at either 120° F. for 7 days or 100° F./100% relative humidity for 3 days.

EXAMPLE 3

A plate was prepared as described in EXAMPLE 1 except that the polyvinyl alcohol release layer was deposited by dip coating. Instead of coating the release layer with a Meyer rod, the polyvinyl phosphonic acid treated plate was dipped in a 0.1% polyvinyl alcohol (Airvol 540) solution for 20 sec., followed by oven drying at 100° C. for 4 min.

The plate was exposed and developed by rubbing 10 times with a cloth damped with ink and fountain solution to check on-press developability and inking; additional 200 rubs were performed to check the durability of the plate. Good performance (good imaging, clean background and good durability) was observed for both fresh plate and 3-month room temperature aged plate.

EXAMPLE 4

A plate was prepared as described in EXAMPLE 1 except that the substrate was thermally treated with silicates instead of polyvinyl phosphonic acid. The electrochemically grained plate was immersed in a 5% aqueous solution of sodium silicates ($Na_2O$:$SiO_2$=about 3:1, diluted from a 40% solution obtained from PPG Industries, Pennsylvania) at 80° C. for 4 min, followed by running tap water rinse for 60 sec. and forced hot air drying.

The same tests as in EXAMPLE 3 were performed. Good performance (good imaging, clean background and good durability) was observed for both fresh plate and 3-month room temperature aged plate.

EXAMPLE 5

Comparative Example for EXAMPLE 4

A plate was prepared as described in EXAMPLE 4 except that there is no releasable interlayer and the photosensitive layer was directly coated onto the sodium silicates treated surface.

The same tests as in EXAMPLE 3 were performed. The fresh plate showed good performance (good imaging, clean background and good durability), but the plate aged at room temperature for 3 months showed heavy ink scumming.

EXAMPLE 6

A plate was prepared as described in EXAMPLE 1 except that the electrochemically grained aluminum was further anodized before polyvinyl phosphonic acid treatment. The electrochemically grained plate was subjected to DC electrochemical anodization at 12 volt in an aqueous sulfuric acid solution (200 g/L of conc. sulfuric acid) at 45° C. for 3 min., followed by running tap water rinse for 60 sec. and forced hot air drying.

The same tests as in EXAMPLE 3 were performed. Good performance (good imaging, clean background and good durability) was observed for both fresh plate and 3-month room temperature aged plate.

EXAMPLE 7

A plate was prepared as described in EXAMPLE 1 except that there is no hydrophilic treatment (such as polyvinyl phosphonic acid or silicates treatment) and the radiation-sensitive layer was coated onto the electrochemically grained substrate with or without polyvinyl alcohol pre-coating (RL-2) with a #5 Meyer rod.

| Formulation RL-2 | Weight (g) |
|---|---|
| Airvol 540 (from Air Products and Chemicals Inc.) | 0.10 |
| Fluorad FC-120 1.0% aqueous solution (from 3M) | 0.10 |
| Water | 100.0 |

The same tests as in EXAMPLE 3 were performed. The plate with polyvinyl alcohol release layer showed good performance (good imaging, clean background and good durability) after aged at room temperature for 1 month. In contrast, the plate without polyvinyl alcohol release layer showed heavy ink scumming after 1 month.

EXAMPLE 8

A copper sheet roughened by chemical etching using a sodium persulfate solution was coated with a radiation-sensitive layer (PS-1 with #5 Meyer rod) with or without polyvinyl alcohol pre-coating (RL-2 with a #5 Meyer rod).

The same tests as in EXAMPLE 3 were performed. The plate with polyvinyl alcohol release layer showed good imaging and clean copper background. In contrast, the plate without polyvinyl alcohol release layer showed heavy ink scumming.

EXAMPLE 9

An aluminum sheet roughened by brushing with a steel brush was coated with radiation-sensitive layer (PS-1) with or without polyvinyl alcohol pre-coating (0.1% Airvol 540 with a #5 Meyer rod).

The same tests as in EXAMPLE 3 were performed. The plate with polyvinyl alcohol release layer showed good imaging, and clean background, but poor durability after aged at room temperature for 1 month. In contrast, the plate without polyvinyl alcohol release layer could not develop cleanly (some ink scumming) after aged at room temperature for 1 month.

EXAMPLE 10

A plate was prepared as described in EXAMPLE 1 except that the radiation-sensitive layer was replaced with the following formulation (using pigment instead of dye):

| Formulation PS-2 | Weight (g) |
|---|---|
| Neocryl B-728 polymer (from Zeneca) | 12.0 |
| Ebecryl RX8301 oligomer (from UCB Chemicals) | 3.21 |
| Sartomer SR-399 monomer (from Sartomer) | 20.0 |
| Irgacure 907 initiator (from Ciba-Geigy) | 1.60 |
| Isopropyl thioxanthone (Sensitizer) | 0.80 |
| Methoxyether hydroquinone (Antioxidant) | 0.04 |
| Irganox 1035 antioxidant (from Ciba Geigy) | 0.04 |
| Microlith Blue 4G-K pigment dispersion (from Ciba Geigy) | 0.32 |
| Leuco crystal violet (Exposure indicator) | 0.32 |
| Pluronic L43 (from BASF) | 1.60 |
| Cyclohexanone | 40.0 |
| Methylethylketone | 360.0 |

The same tests as in EXAMPLE 3 were performed. Good performance (good imaging, clean background, and good durability) was observed for both fresh plate and 3-month room temperature aged plate.

EXAMPLE 11

The radiation-sensitive layer coated plate in EXAMPLE 1 was further coated with a 2.0% aqueous solution of polyvinyl alcohol (Airvol 603 from Air Products and Chemicals, Inc.) with a #4 Meyer rod, followed by drying at 100° C. for 4 min.

The same tests as in EXAMPLE 3 were performed. Good performance (good imaging, clean background and good durability) was observed for both fresh plate and 3-month room temperature aged plate.

EXAMPLE 12

This example illustrates that incorporation of releasable interlayer allows the use of epoxy resins (which is prone to causing ink scumming) in the radiation-sensitive layer. A plate was prepared as described in EXAMPLE 1 except that the radiation-sensitive layer was replaced with the following formulation coated with a #5 Meyer rod:

| Formulation PS-3 | Weight (g) |
|---|---|
| Epon 1031 (epoxy resin from Shell Chemicals) | 2.0 |
| Cyracure UVR-6110 (epoxy resin from Union Carbide) | 6.0 |
| Cyracure UVI-6974 (photoinitiator from Union Carbide) | 1.0 |
| Neocryl B-728 (polymer from Zeneca) | 1.0 |
| Methylethylketone | 90 |

A plate prepared above was placed under a negative mask in a vacuum frame and exposed to a UV light with an emission peak at about 364 nm for 10 min. The plates were exposed and rubbed 10 times with a cloth damped with ink and fountain solution to check on-press developability and inking. Good imaging and clean background were observed for both fresh and 1 month room temperature aged plates.

EXAMPLE 13

Comparative Example for EXAMPLE 12

A plate was prepared according to the same procedure and composition in EXAMPLE 12 except that no polyvinyl alcohol interlayer was coated (The epoxy radiation-sensitive layer was directly coated onto the polyvinyl phosphonic acid treated substrate.). The same tests as in EXAMPLE 12 were performed. The tested plate showed heavy ink scumming in the non-exposed areas.

EXAMPLE 14

This example illustrates the preparation of a plate which is sensitized to visible light. A plate was prepared as described in EXAMPLE 1 except that the radiation-sensitive layer was replaced with the following formulation (using a visible light-sensitive free-radical initiator which has good absorbency from 400 to 535 nm).

| Formulation PS-4 | Weight (g) |
|---|---|
| Neocryl B-728 polymer (from Zeneca) | 16.0 |
| Ebecryl RX8301 oligomer (from UCB Chemicals) | 3.21 |
| Sartomer SR-399 monomer (from Sartomer) | 20.0 |
| Irgacure 784 visible light initiator (from Ciba-Geigy) | 1.80 |
| Methoxyether hydroquinone (Antioxidant) | 0.04 |
| Irganox 1035 antioxidant (from Ciba Geigy) | 0.04 |
| Orasol Blue GN (from Ciba Geigy) | 0.32 |
| Leuco crystal violet (Exposure indicator) | 0.32 |
| Pluronic L43 surfactant (from BASF) | 1.60 |
| Cyclohexanone | 40.0 |
| Methylethylketone | 360.0 |

The plate was exposed under a negative mask in a vacuum frame with an office-type fluorescence light source (total of 120 watts) for 10 min. The same tests as in EXAMPLE 3 were performed. This plate showed good imaging, clean background and good durability.

EXAMPLE 15

This example illustrates mass-transfer of image-forming materials from an external source through inkjet process onto the substrate-release layer component to form an imaged plate. An aluminum substrate with electrochemical roughening and polyvinyl phosphonic acid treatment was coated with a water-soluble polymer releasable interlayer (RL-1) using a #5 Meyer rod, followed by drying at 100° C. for 6 min. This release layer coated substrate was imaged with an inkjet printer (StyleWriter from Apple Computer Company) and then baked at 120° C. for 5 min. The inkjet imaged plate was rubbed with a cloth damped with both fountain solution and ink. Good image in the printed areas and clean background in the non-printed areas were observed.

EXAMPLE 16

This example illustrates mass-transfer of image-forming materials from an external source through electrophotographic process onto the substrate-release layer component to form an imaged plate. An aluminum substrate with electrochemical roughening and polyvinyl phosphonic acid treatment was coated with a water-soluble polymer releasable interlayer (RL-1) using a #5 Meyer rod, followed by drying at 100° C. for 6 min. This release layer coated substrate was imaged with a laser printer (from Hewlett-Packard Company) and then baked at 120° C. for 5 min. The laser printer imaged plate was rubbed with a cloth damped with both fountain solution and ink. Good image in the printed areas and clean background in the non-printed areas were obtained.

EXAMPLE 17

In this example, the substrate was obtained by stripping the photosensitive layer of a commercial lithographic printing plate having an electrochemically grained and anodized substrate (purchased from Polychrome Corporation). The plate has a dimension of 11 inches×18.5 inches×0.005 inches, which dimension allows direct test on a commercial printing press.

The substrate was obtained by stripping the photosensitive layer of the plate with isopropanol. This substrate was retreated with polyvinyl phosphonic acid by immersing in an aqueous solution of 0.1% polyvinyl phosphonic acid at 60° C. for 4 min., followed by rinse with running water for 60 sec. and drying in an oven at 100° C. for 4 min.

The polyvinyl phosphonic acid thermally treated aluminum sheets were coated with an aqueous solution of 0.1% polyvinyl alcohol (RL-1 of EXAMPLE 1) using a #5 Meyer rod, followed by drying at 100° C. for 6 min.

The polyvinyl alcohol coated aluminum sheets were further coated with the radiation-sensitive formulation used in EXAMPLE 1 (PS-1, #5 Meyer rod), followed by drying with forced hot air.

Three plates were prepared. All were imaged with a NuArc N1500 Pulsed Xenon Printer. The plate was placed under a negative film and a UGRA target mask in a vacuum frame and exposed to UV light to achieve a Stouffer step of about 4 in a 21-step Stouffer sensitivity guide.

The first plate exposed above was tested for conventional development with isopropanol as developer. About 50 grams of isopropanol was poured on the plate and was spread across the whole plate with a cloth. The dissolved radiation-sensitive layer was wiped off with the cloth. The plate was further cleaned by wiping with a clean cloth and additional isopropanol. The developed plate was wiped with a gum arabic solution (from Varn, Oakland, N.J.) and then tested for inking by spraying with fountain solution and rubbing with a cloth damped with both fountain solution and ink for 10 times. Additional 200 rubs were performed to check the durability of the plate. This solvent-developed plate showed good imaging, clean background, and good durability (no wearing off at 200 rubs).

The second plate was developed by hand with ink and fountain solution (to simulate on-press development). It was developed by rubbing 10 times with a cloth damped with ink and fountain solution to check on-press developability and inking; additional 200 rubs were performed to check the durability of the plate. Good imaging, clean background and good durability (same as for the plate in EXAMPLE 1) were observed.

The third plate was tested on a Hamada 602 CD duplicate wet lithographic printing press equipped with both ink (Van Son Rubber Base Plus BS151 Black #10850, by Holland Ink Corporation, Holland) and fountain solution (Superlene All Purpose Fountain Solution Concentrate, diluted with 5 times of water, from Varn, Oakland, N.J.). The exposed plate was mounted on the press, damped with fountain solution for 10 sec., rolled up with ink for 10 sec., and then printed to the blanket and receiving paper. Under 5 impressions, good prints were obtained. The press continued to run for a total of 10,000 impressions without showing any wearing or other defects.

I claim:

1. A lithographic printing plate comprising:

(a) a substrate with rough and/or porous surface on at least one side, said rough and/or porous surface comprising a microscopic structure selected from the group consisting of irregular peaks, valleys, holes, and pores that are capable of mechanical interlocking with a coating deposited thereon;

(b) a releasable interlayer deposited on the rough and/or porous surface of said substrate, said releasable interlayer being soluble or dispersible in a liquid selected from the group consisting of water, fountain solution, ink, aqueous and solvent plate developers, organic solvents, and press cleaners; wherein said releasable interlayer is substantially conformally coated on the microscopic structures of the substrate surface and is thin enough in thickness so that, the releasable interlayer coated substrate has microscopic surface profiles similar to those of the substrate, and a coating on the releasable interlayer is capable of bonding to the substrate through mechanical interlocking and is incapable of being removed without deforming or breaking the coating or the substrate surface structures even if the releasable interlayer is dissolved away; and (c) a radiation-sensitive layer on the releasable interlayer, said radiation-sensitive layer exhibiting an affinity or aversion substantially opposite to the affinity or aversion of said substrate to at least one printing liquid selected from the group consisting of ink and an abhesive fluid for ink.

2. The printing plate of claim 1 wherein the releasable interlayer has an average coverage of about 1 to about 200 $mg/m^2$ and the substrate has an average surface roughness Ra of about 0.2 to about 2.0 micrometer.

3. The printing plate of claim 1 wherein the releasable interlayer has an average coverage of about 4 to about 40 $mg/m^2$ and the substrate has an average surface roughness Ra of about 0.4 to about 1.0 micrometer.

4. The printing plate of claim 1 wherein the releasable interlayer is soluble or dispersible in water.

5. The printing plate of claim 4 wherein the releasable interlayer comprises a water-soluble polymer.

6. The printing plate of claim 5 wherein said water-soluble polymer is selected from the group consisting of polyvinyl alcohol, polyvinylpyrrolidone, poly(2-ethyl-2-oxazoline), polyethylene glycol, polypropylene glycol, polyvinyl phosphonic acid, and gum arabic.

7. The printing plate of claim 6 wherein the water-soluble polymer is polyvinyl alcohol.

8. The printing plate of claim 1 wherein the substrate is a roughened aluminum.

9. The printing plate of claim 8 wherein said roughened aluminum is further anodized.

10. The printing plate of claim 8 wherein said roughened aluminum is a mechanically roughened aluminum.

11. The printing plate of claim 8 wherein said roughened aluminum is a chemically roughened aluminum.

12. The printing plate of claim 8 wherein said roughened aluminum is an electrochemically roughened aluminum.

13. The printing plate of claim 1 wherein the substrate is a roughened, anodized, and hydrophilic material-coated aluminum, said hydrophilic material being insoluble in fountain solution, ink, and a suitable plate developer.

14. The printing plate of claim 13 wherein the hydrophilic material is deposited from a solution of a material selected from the group consisting of sodium silicates, polyvinyl phosphonic acid and its salts, and copolymers of vinyl phosphonic acid and acrylamide and their salts.

15. The printing plate of claim 1 wherein the substrate is hydrophilic and the radiation-sensitive layer is oleophilic.

16. The printing plate of claim 1 wherein the substrate is oleophilic and the radiation-sensitive layer is oleophobic.

17. The printing plate of claim 1 wherein the radiation-sensitive layer is capable of hardening or solubilization upon exposure to an actinic radiation.

18. A method of manufacturing a lithographic printing plate, comprising:

(a) providing a substrate with tough and/or porous surface on at least one side, said rough and/or porous surface comprising a microscopic structure selected from the group consisting of irregular peaks, valleys, holes, and pores that are capable of mechanical interlocking with a coating deposited thereon;

(b) depositing a releasable interlayer on the rough and/or porous surface of said substrate, said releasable interlayer being soluble or dispersible in a liquid selected from the group consisting of water, fountain solution, ink, aqueous and solvent plate developers, organic solvents, and press cleaners; wherein said releasable interlayer is substantially conformally coated on the microscopic structures of the substrate surface and is thin enough in thickness so that, the releasable interlayer coated substrate has microscopic surface profiles similar to those of the substrate, and a coating on the releasable interlayer is capable of bonding to the substrate through mechanical interlocking and is incapable of being removed without deforming or breaking the coating or the substrate surface structures even if the releasable interlayer is dissolved away; and (c) depositing on the releasable interlayer a radiation-sensitive layer, said radiation-sensitive layer exhibiting an affinity or aversion substantially opposite to the affinity or aversion of said substrate to at least one printing liquid selected from the group consisting of ink and an abhesive fluid for ink.

19. The method of claim 18 wherein the releasable interlayer has an average coverage of about 1 to about 200 $mg/m^2$ and the substrate has an average surface roughness Ra of about 0.2 to about 2.0 micrometer.

20. The method of claim 19 wherein the releasable interlayer has an average coverage of about 4 to about 40 $mg/m^2$ and the substrate has an average surface roughness Ra of about 0.4 to about 1.0 micrometer.

21. A method of lithographically printing images on a receiving medium, comprising:

(a) providing a lithographic printing plate comprising:

(i) a substrate with rough and/or porous surface on at least one side, said rough and/or porous surface comprising a microscopic structure selected from the group consisting of irregular peaks, valleys, holes, and pores that are capable of mechanical interlocking with a coating deposited thereon;

(ii) a releasable interlayer deposited on the rough and/or porous surface of said substrate, said releasable interlayer being soluble or dispersible in ink (for waterless plate) or in ink and/or fountain solution (for wet plate); wherein said releasable interlayer is substantially conformally coated on the microscopic structures of the substrate surface and is thin enough in thickness so that, the releasable interlayer coated substrate has microscopic surface profiles similar to those of the substrate, and a coating on the releasable interlayer is capable of bonding to the substrate through mechanical interlocking and is incapable of being removed without deforming or breaking the coating or the substrate surface structures even if the releasable interlayer is dissolved away; and (iii) a radiation-sensitive layer capable of hardening or solubilization upon exposure to an actinic radiation, the non-hardened or solubilized areas of said radiation-sensitive layer being soluble or dispersible in ink (for waterless plate) or in ink and/or fountain solution (for wet plate), and said radiation-sensitive layer exhibiting an affinity or aversion substantially opposite to the affinity or aversion of said substrate to at least one printing liquid selected from the group consisting of ink and an abhesive fluid for ink;

(b) exposing the plate with an actinic radiation to cause hardening or solubilization of the exposed areas;

(c) directly placing the exposed plate on a printing press equipped with ink (for waterless plate) or with both ink and fountain solution (for wet plate); and (d) operating said printing press to contact said exposed plate with ink or with ink and/or fountain solution to remove the non-hardened or solubilized areas, and to lithographically print images from said plate to the receiving medium.

22. The method of claim 21 wherein the releasable interlayer has an average coverage of about 1 to about 200 $mg/m^2$ and the substrate has an average surface roughness Ra of about 0.2 to about 2.0 micrometer.

23. The method of claim 22 wherein the releasable interlayer has an average coverage of about 4 to about 40 $mg/m^2$ and the substrate has an average surface roughness Ra of about 0.4 to about 1.0 micrometer.

24. The method of claim 21 wherein the substrate is oleophilic, the releasable interlayer is soluble or dispersible in ink, and the radiation-sensitive layer is oleophobic; and the plate is printed on a waterless press.

25. The method of claim 21 wherein the substrate is hydrophilic, the releasable interlayer is soluble or dispersible in ink and/or fountain solution, and the radiation-sensitive layer is oleophilic; and the plate is printed on a wet press.

26. The method of claim 21 wherein said substrate is a grained and anodized aluminum comprising on the surface a water-insoluble hydrophilic layer deposited from a solution of a material selected from the group consisting of sodium silicates, polyvinyl phosphonic acid and its salts, and copolymers of vinyl phosphonic acid and acrylamide and their salts; said releasable interlayer comprises a water-soluble polymer; and said radiation-sensitive layer comprises, at least, an oleophilic polymeric binder, a monomer or oligomer with at least one acrylate or methacrylate functional group, and a radiation-sensitive free-radical initiator.

27. The method of claim 26 wherein said water-soluble polymer is polyvinyl alcohol.

28. The method of claim 26 wherein the printing plate further includes a water-soluble or water-dispersible layer on the radiation-sensitive layer.

29. A substrate-release layer component, suitable for the manufacture of lithographic printing plates by further depositing a radiation-sensitive layer on the release layer to form a pre-sensitized plate or by imagewise transferring an image-forming material from an external material source onto the release layer to form an imaged plate, comprising:

(a) a substrate with rough and/or porous surface on at least one side, said rough and/or porous surface comprising a microscopic structure selected from the group consisting of irregular peaks, valleys, holes, and pores that are capable of mechanical interlocking with a coating deposited thereon; and (b) a release layer deposited on the rough and/or porous surface of said substrate, said release layer being soluble or dispersible in a liquid selected from the group consisting of water, fountain solution, ink, aqueous and solvent plate developers, organic solvents, and press cleaners; wherein said release layer is substantially conformally coated on the microscopic structures of the substrate surface and is thin enough in thickness so that, the release layer coated substrate has microscopic surface profiles similar to those of the substrate, and a coating on the release layer is capable of bonding to the substrate through mechanical interlocking and is incapable of being removed without deforming or breaking the coating or the substrate surface structures even if the release layer is dissolved away.

30. The substrate-release layer component of claim 29 wherein the release layer has an average coverage of about 1 to about 200 $mg/m^2$ and the substrate has an average surface roughness Ra of about 0.2 to about 2.0 micrometer.

31. The substrate-release layer component of claim 30 wherein the release layer has an average coverage of about 4 to about 40 $mg/m^2$ and the substrate has an average surface roughness Ra of about 0.4 to about 1.0 micrometer.

32. The substrate-release layer component of claim 29 wherein said substrate is a roughened aluminum.

33. The substrate-release layer component of claim 32 wherein said roughened aluminum is selected from the group consisting of mechanically roughened aluminum, chemically roughened aluminum, and electrochemically roughened aluminum.

34. The substrate-release layer component of claim 33 wherein said roughened aluminum is an electrochemically roughened aluminum.

35. The substrate-release layer component of claim 33 wherein said roughened aluminum is further anodized.

36. The substrate-release layer component of claim 29 wherein the substrate is a roughened, anodized, and hydrophilic material-coated aluminum, said hydrophilic material being insoluble in fountain solution, ink, and a suitable plate developer.

37. The substrate-release layer component of claim 29 wherein said release layer comprises a water-soluble polymer.

38. The substrate-release layer component of claim 37 wherein said water-soluble polymer is polyvinyl alcohol.

* * * * *